(12) United States Patent
Taguchi (10) Patent No.: US 6,445,013 B1
(45) Date of Patent: *Sep. 3, 2002

(54) GATE COMMUTATED TURN-OFF SEMICONDUCTOR DEVICE

(75) Inventor: Kazunori Taguchi, Tokyo (JP)

(73) Assignee: Mitsubishi Denki Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/549,062

(22) Filed: Apr. 13, 2000

(51) Int. Cl.[7] ............... H01L 29/74; H01L 31/111; H01L 23/34; H01L 23/48
(52) U.S. Cl. .............. 257/138; 257/147; 257/150; 257/127; 257/181; 257/182; 257/719; 257/768
(58) Field of Search ............... 257/138, 147, 257/150, 127, 181, 182, 719, 768

(56) References Cited

U.S. PATENT DOCUMENTS

| | | | | |
|---|---|---|---|---|
| 4,257,058 A | * | 3/1981 | Ferro et al. | 357/30 |
| 4,374,393 A | * | 2/1983 | Kamahara | 357/30 |
| 4,757,367 A | * | 7/1988 | Konishi et al. | 357/38 |
| 5,121,189 A | * | 6/1992 | Niwayama | 357/79 |
| 5,278,434 A | * | 1/1994 | Niwayama | 257/181 |
| 5,652,467 A | * | 7/1997 | Onose et al. | 257/785 |
| 5,739,556 A | * | 4/1998 | Bolgiani | 257/182 |
| 5,777,351 A | | 7/1998 | Taguchi et al. | |

FOREIGN PATENT DOCUMENTS

| | | | |
|---|---|---|---|
| JP | 56-125863 | 10/1981 | |
| JP | 8-330572 | 12/1996 | |
| JP | 10-294406 | 11/1998 | |
| JP | 2001077350 | * | 3/2001 |

\* cited by examiner

Primary Examiner—Jerome Jackson, Jr.
Assistant Examiner—Joseph Nguyen
(74) Attorney, Agent, or Firm—Oblon, Spivak, McClelland, Maier & Neustadt, P.C.

(57) ABSTRACT

A first cathode flange (14) provided with branch-like protrusions (14d) extending towards substantially its outer periphery and a gate flange (15) provided with branch-like protrusions (15c) extending towards substantially its outer periphery are connected to a cathode electrode (7a) and a gate electrode (7b), respectively, formed on one surface of a gate drive substrate (7). With this structure, a gate commutated turn-off semiconductor device which eliminates the necessity of a gate spacer and a cathode spacer and allows reduction in time and cost required for manufacture can be achieved.

12 Claims, 10 Drawing Sheets

GATE COMMUTATED TURN-OFF SEMICONDUCTOR DEVICE

BACKGROUND OF THE INVENTION

1. Field of the Invention

The present invention relates to a gate commutated turn-off semiconductor device comprising a gate commutated turn-off (GCT) semiconductor switching element capable of commutating most of a main current flowing between an anode and a cathode at a turn-on into a gate side at a turn-off.

2. Description of the Background Art

In a prior-art GTO (Gate Turn-Off) thyristor, to give a signal to a gate electrode, a method of gate connection from one direction (see, for example, a technique disclosed in Japanese Patent Application Laid Open Gazette No. 56-125863 and the like) has been widely adopted. In such a structure, however, it is difficult to immediately stop a main current flowing between an anode and a cathode at a turn-off because of large inductance in a gate of an element.

For this reason, a GCT thyristor which allows reduction of gate inductance in an element has been developed. The GCT thyristor adopts a connection structure comprising a ring-shaped gate connection structure, a ring-shaped gate connection terminal formed on a gate drive substrate and a gate driver for controlling a current flowing in the gate (see, for example, techniques disclosed in Japanese Patent Application Laid Open Gazette Nos. 10-294406 and 8-330572 and the like), instead of the method of drawing a gate current from one direction. This makes it possible to reduce the inductance of a loop including the GCT thyristor, the gate drive substrate and the gate driver (referred to as inductance on the gate side) to about a hundredth of that of the GTO thyristor.

In the GCT thyristor, with the inductance value on the gate side remarkably reduced to be lower than that of the GTO thyristor, a gate reverse current rise rate ($di_{GQ}/dt$) at a turn-off is raised up to a value about hundredth times as high as that of the GTO thyristor and almost all the main current can be thereby commutated into the gate side in a short time at the turn-off. In other words, it is possible to cut the time required to turn off and make the value of a turn-off gain almost one. Thus, the turn-off characteristics can be improved.

Further, with this, it is possible to suppress a breakdown due to local heat generation inside a semiconductor substrate and as a result, it also becomes possible to control a large current.

Figure 11:
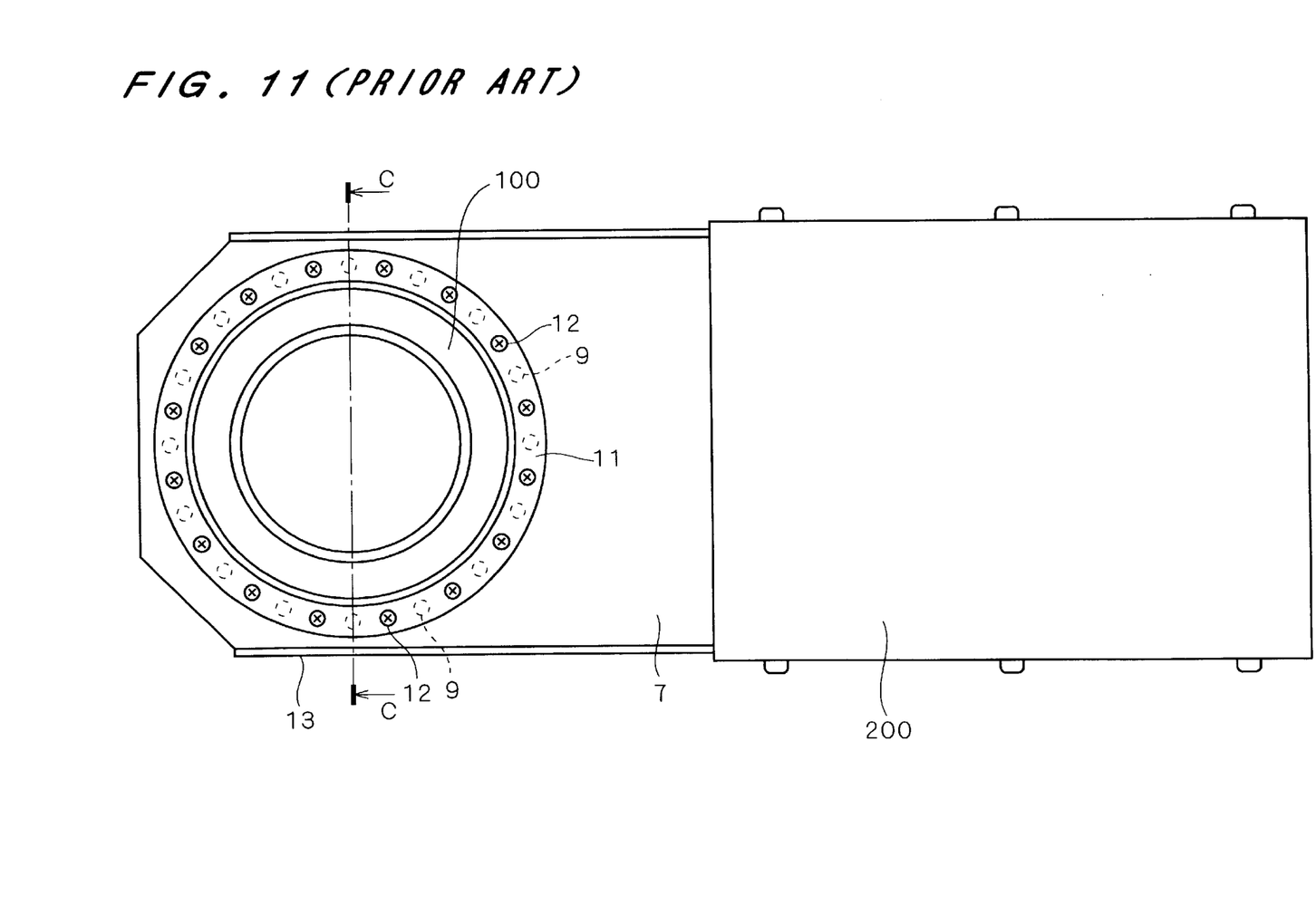
FIG. 11 is a plan view showing a gate commutated turn-off semiconductor device in the prior art.

FIG. 11 is a plan view showing an exemplary constitution of a gate commutated turn-off semiconductor device including a GCT thyristor in the prior art. This gate commutated turn-off semiconductor device comprises a gate drive substrate 7, a GCT thyristor 100 fixed to the gate drive substrate 7 and a gate driver 200 connected to the gate drive substrate 7. Further, a case 13 is attached to the gate drive substrate 7 so as to cover a lower surface thereof. The case 13 also serves as a reinforcing member to prevent a bend of the gate drive substrate 7 due to a load of the gate driver 200.

Figure 12:
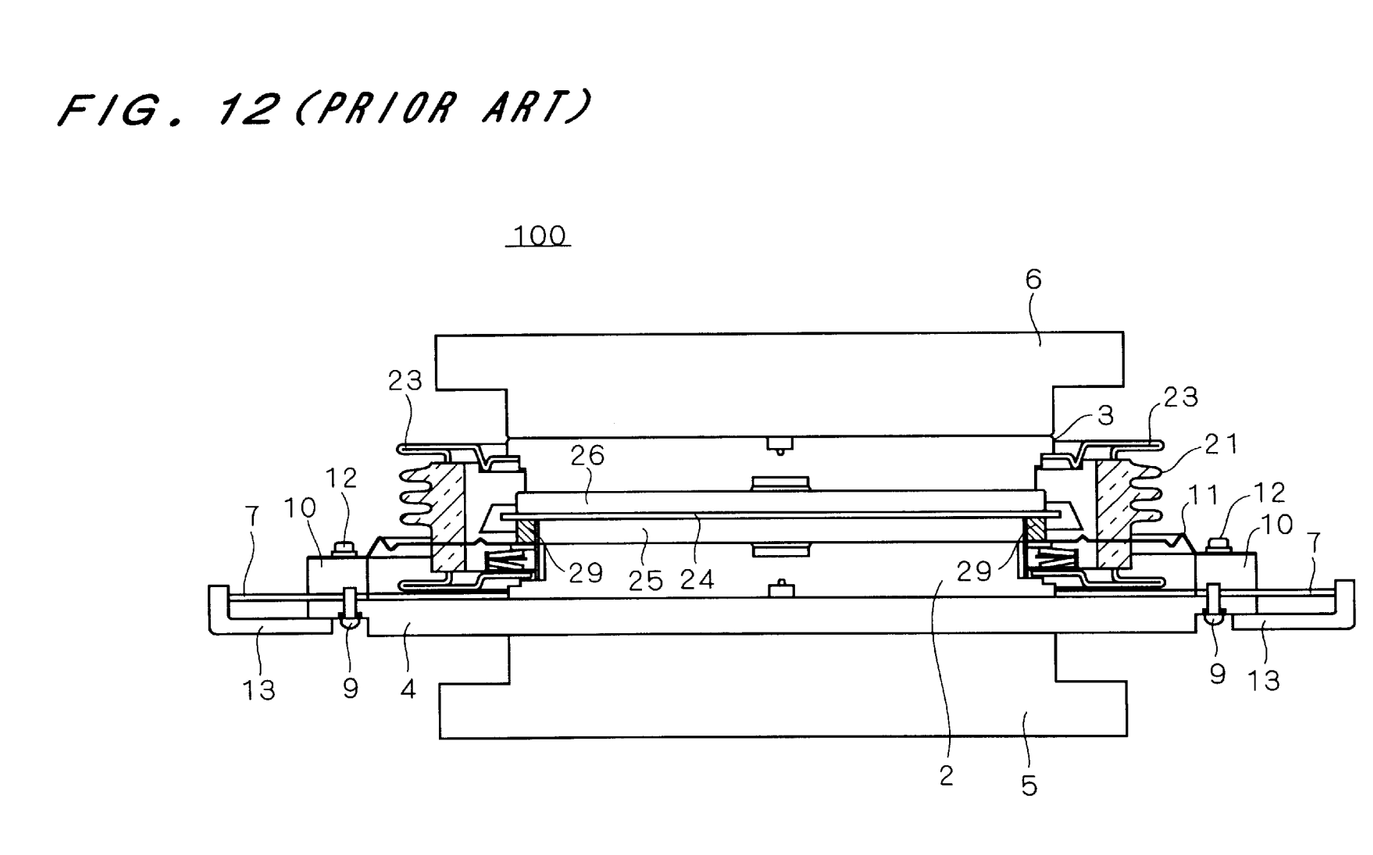
FIG. 12 is a cross section of a GCT thyristor 100 included in the gate commutated turn-off semiconductor device in the prior art.
Figure 13:
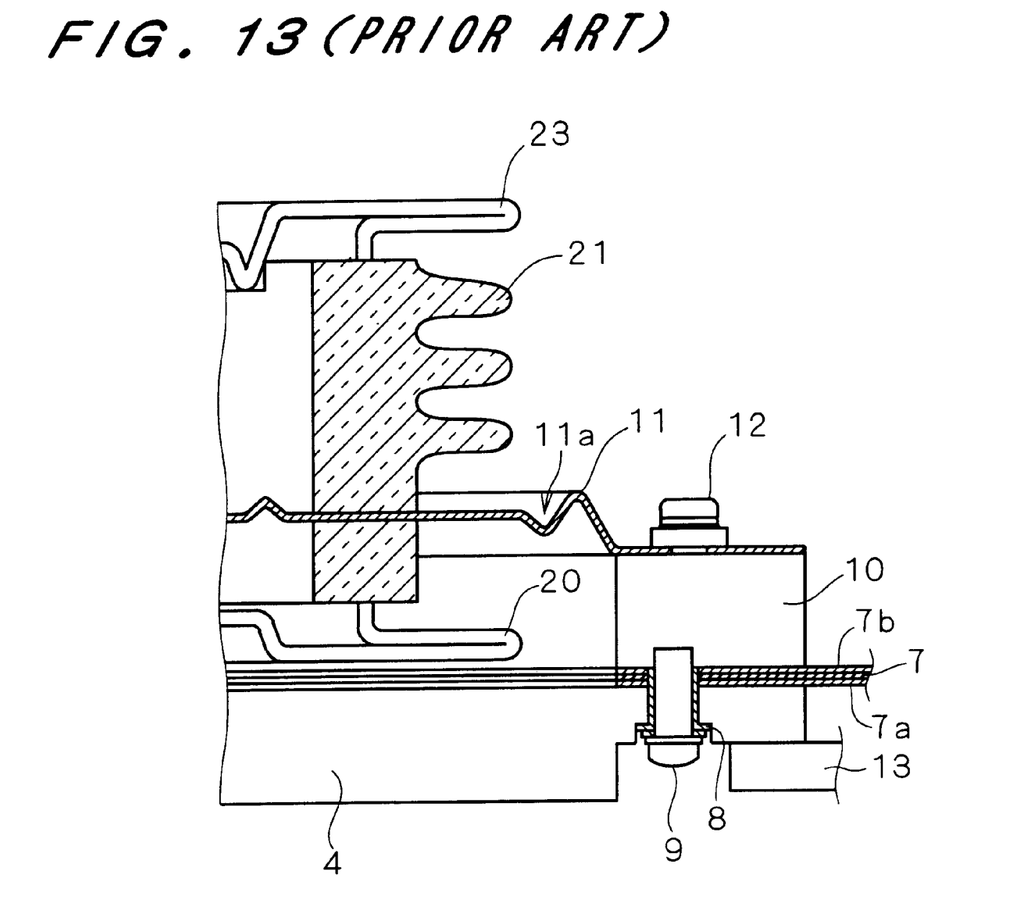
FIG. 13 is a cross section showing an enlarged part of the GCT thyristor 100 included in the gate commutated turn-off semiconductor device in the prior art.

FIG. 12 is a cross section taken in the section line C—C of FIG. 11, and FIG. 13 is a cross section showing an enlarged part of FIG. 12. The GCT thyristor 100 comprises a disk-shaped semiconductor substrate (wafer) 24 having a pnpn structure and a gate region on its outer peripheral side, a cathode strain buffer plate 25 connected to a cathode region of the semiconductor substrate 24 and an anode strain buffer plate 26 connected to an anode region of the semiconductor substrate 24, on its center portion. A cathode post electrode 2 is connected to the cathode strain buffer plate 25 and an anode post electrode 3 is connected to the anode strain buffer plate 26. Further, a conductive cathode spacer 4 is connected to the cathode post electrode 2 and a cathode fin electrode 5 is connected to the cathode spacer 4. An anode fin electrode 6 is connected to the anode post electrode 3. The semiconductor substrate 24, the cathode strain buffer plate 25, the anode strain buffer plate 26, the cathode post electrode 2, the anode post electrode 3 and the cathode spacer 4 are sandwiched and pressed by the cathode fin electrode 5 and the anode fin electrode 6.

The GCT thyristor 100 comprises a ring-shaped cathode flange 20 held by the cathode post electrode 2 penetrating therethrough and a ring-shaped anode flange 23 held by the anode post electrode 3 penetrating therethrough. An insulating tube 21 made of ceramics (e.g., alumina) is provided between the cathode flange 20 and the anode flange 23. In FIG. 12, the semiconductor substrate 24, the cathode strain buffer plate 25, the anode strain buffer plate 26, the cathode post electrode 2 and the anode post electrode 3 penetrate as a unit through the insulating tube 21.

As shown in FIG. 13, a gate electrode 7b is formed on an upper surface of the gate drive substrate 7 to serve as a passage of a current between the gate driver 200 and a gate of the GCT thyristor 100. On the other hand, a cathode electrode 7a is formed on a lower surface of the gate drive substrate 7 to serve as a passage of a current between the gate driver 200 and a cathode of the GCT thyristor 100. Providing the cathode electrode 7a and the gate electrode 7b forms a loop between the gate and cathode of the GCT thyristor 100 and the gate driver 200. With a gate current flowing into this loop at a commutation, the main current flowing between the cathode and anode of the GCT thyristor 100 is immediately stopped.

In the semiconductor substrate 24 of FIG. 12, the gate region is formed on a side of the cathode region and a ring-shaped gate electrode 29 is so formed as to be connected to the gate region. The gate electrode 29 is connected to an inner peripheral side of a ring-shaped gate flange 11, and the gate flange 11, being sandwiched by the insulating tube 21, protrudes from a side surface of the insulating tube 21 and extends towards the outside of the insulating tube 21. A portion of the gate flange 11 extendedly existing outside the insulating tube 21 is threaded into a conductive gate spacer 10 with a screw 12. Further, the gate flange 11 is provided with a bend portion 11a to absorb oscillation and stress caused by a switching operation.

The gate spacer 10 is connected to the gate electrode 7b on the upper surface of the gate drive substrate 7 and threaded into the gate drive substrate 7 with a screw 9. The cathode spacer 4 is connected to the cathode electrode 7a on the lower surface of the gate drive substrate 7 and threaded into the gate drive substrate 7 with the screw 9.

Further, to prevent a short circuit between a pair of the cathode spacer 4 and the cathode electrode 7a and a pair of the gate spacer 10 and the gate electrode 7b due to presence of the screw 9, a screw hole for the screw 9 is provided with an insulating bush 8.

In the above-described gate commutated turn-off semiconductor device, the cathode spacer 4 has a function of holding a load of the gate driver 200 by fixing the gate drive substrate 7 and the case 13 to the GCT thyristor 100. If only this function is needed, a case having a structure in which the case 13 and the cathode spacer 4 are formed as a unit may be used. The cathode spacer 4, however, also has a function of achieving an excellent conductivity with both the cathode post electrode 2 and the cathode fin electrode 5 and a function of achieving an excellent conductivity with the cathode electrode 7a on the lower surface of the gate drive substrate 7. To achieve such an excellent conductivity, it is necessary that the cathode spacer 4 should come into contact with respective surfaces of the cathode post electrode 2, the cathode fin electrode 5 and the gate drive substrate 7 while keeping a highly precise flatness on its surface. For this reason, a conductive disk-like member having a thickness of 5 to 10 mm other than the case 13 is processed to be used as the cathode spacer 4.

Further, as the gate spacer 10, like the cathode spacer 4, a conductive ring-shaped member having a thickness of 5 to 10 mm which is so processed as to have a highly precise flatness on its surface is used in order to achieve an excellent conductivity with the gate flange 11 and the gate electrode 7b on the upper surface of the gate drive substrate 7.

Providing the cathode spacer 4 and the gate spacer 10, however, causes an increase in number of required parts and requiring the highly precise flatness on their surfaces is an obstacle to cost reduction. Further, this causes an increase in weight of the gate commutated turn-off semiconductor device.

Furthermore, in the above-described gate commutated turn-off semiconductor device, to avoid complication in shape of the cathode spacer 4 and the gate spacer 10, the gate spacer 10 is provided on the upper surface of the gate drive substrate 7 and the cathode spacer 4 is provided on the lower surface thereof, instead of providing both the spacers 4 and 10 on one surface of the gate drive substrate 7. Accordingly, the gate electrode 7b is formed on the upper surface of the gate drive substrate 7 and the cathode electrode 7a is formed on the lower surface thereof.

Forming electrode patterns on both the upper and lower surfaces of the gate drive substrate 7, however, requires complicated steps such as inversion of the gate drive substrate 7 in the manufacturing process, and thereby becomes an obstacle to reduction in time and cost required for the manufacture.

Further, for easy attachment and detachment of the gate flange 11 and the cathode flange 20 in maintenance, the gate flange 11 is fixed with the screw 12 and the cathode spacer 4 and the gate spacer 10 are fixed with the screw 9.

Attachment of the screws 12 and 9 to the upper and lower surfaces of the gate drive substrate 7 respectively, however, also leads to complication such as inversion of the gate drive substrate 7 in the manufacturing process and difficulty in detachment of the screws in the maintenance, and therefore becomes an obstacle to reduction in time and cost required for the manufacture and maintenance. Further, for the screw 9, providing the insulating bush 8 is needed to ensure insulation between the gate and cathode, and this is also an obstacle to reduction in time and cost required for the manufacture.

SUMMARY OF THE INVENTION

The present invention is directed to a gate commutated turn-off semiconductor device. According to a first aspect of the present invention, the gate commutated turn-off semiconductor device comprises: a gate commutated turn-off semiconductor element having an anode, a cathode and a gate, for commutating a main current flowing from the anode to the cathode into a side of the gate at a turn-off; a gate driver for controlling a current flowing in the gate; and a substrate provided with a circuit pattern on its surface, the circuit pattern electrically connecting the gate and the cathode of the gate commutated turn-off semiconductor element to the gate driver to form an electrical loop, and the gate commutated turn-off semiconductor element has a semiconductor substrate having a cathode region, an anode region and a gate region, in which the gate region is formed on an outer peripheral side of one main surface, the cathode region is formed inside the gate region of the one main surface and the anode region is formed on the other main surface opposed to the one main surface; a gate electrode in a ring shape connected electrically to the gate region; a cathode post electrode connected electrically to the cathode region; an anode post electrode connected electrically to the anode region; an insulating tube being electrically insulative, provided so as to surround the anode post electrode and the cathode post electrode and internally containing at least the semiconductor substrate and the gate electrode; a gate flange having an inner peripheral side connected electrically to the gate electrode and an outer peripheral edge portion protruding from a side surface of the insulating tube; and a cathode flange connected electrically to the cathode post electrode, and in the gate commutated turn-off semiconductor device of the first aspect, the cathode flange and the gate flange each include a branch-like protrusion extending towards an outer periphery thereof, the cathode of the gate commutated turn-off semiconductor element is electrically connected to the substrate and the cathode flange is fixed to the substrate with the branch-like protrusion interposed therebetween, and the gate of the gate commutated turn-off semiconductor element is electrically connected to the substrate and the gate flange is fixed to the substrate with the branch-like protrusion interposed therebetween.

According to a second aspect of the present invention, in the gate commutated turn-off semiconductor device of the first aspect, the substrate has a first main surface and a second main surface opposed to the first main surface, the circuit pattern includes a first circuit pattern formed on the first main surface, for electrically connecting the cathode to the gate driver, and a second circuit pattern formed on the first main surface, for electrically connecting the gate to the gate driver, the branch-like protrusion included in the cathode flange is connected to the first circuit pattern, and the branch-like protrusion included in the gate flange is connected to the second circuit pattern.

According to a third aspect of the present invention, in the gate commutated turn-off semiconductor device of the first aspect, the substrate has a first main surface and a second main surface opposed to the first main surface, the circuit pattern includes a first circuit pattern formed on the first main surface, for electrically connecting the cathode to the gate driver, and a second circuit pattern formed on the second main surface, for electrically connecting the gate to the gate driver, the branch-like protrusion included in the cathode flange is connected to the first circuit pattern, and the branch-like protrusion included in the gate flange is connected to the second circuit pattern.

According to a fourth aspect of the present invention, in the gate commutated turn-off semiconductor device of the first aspect, the gate commutated turn-off semiconductor element further comprises a cathode fin electrode connected electrically to the cathode flange, the cathode flange is a member sandwiched between the cathode post electrode and the cathode fin electrode, and the branch-like protrusion and the member are formed as a unit.

According to a fifth aspect of the present invention, in the gate commutated turn-off semiconductor device of the first aspect, the cathode flange is a member surrounding the cathode post electrode, and the branch-like protrusion is formed with another member different from the member fixed thereto.

According to a sixth aspect of the present invention, in the gate commutated turn-off semiconductor device of the first aspect, the branch-like protrusion of at least one of the cathode flange and the gate flange has a bend portion.

According to a seventh aspect of the present invention, in the gate commutated turn-off semiconductor device of the first aspect, the cathode flange and the gate flange each include at least three branch-like protrusions.

According to an eighth aspect of the present invention, in the gate commutated turn-off semiconductor device of the first aspect, the substrate has a reinforcing member fixed to the surface thereof.

According to a ninth aspect of the present invention, in the gate commutated turn-off semiconductor device of the eighth aspect, the gate commutated turn-off semiconductor element further comprises a cathode fin electrode connected electrically to the cathode flange, and the reinforcing member comprises an upright portion perpendicular to the substrate and the cathode fin electrode is fixed to the upright portion.

According to a tenth aspect of the present invention, in the gate commutated turn-off semiconductor device of the first aspect, the branch-like protrusion is provided with a screw hole in the vicinity of its tip portion, the substrate is provided with screw pedestals, a screw penetrates through the screw hole of said gate flange and is threaded to one of the screw pedestals to fix the gate flange to the substrate, and a screw penetrates through the screw hole of said cathode flange and is threaded to another of the screw pedestals to fix the cathode flange to the substrate.

In the gate commutated turn-off semiconductor device of the first aspect of the present invention, since the gate flange and the cathode flange are fixed to the substrate by using neither the cathode spacer nor the gate spacer adopted in the prior-art gate commutated turn-off semiconductor device, it is possible to fix the gate commutated turn-off semiconductor device to the substrate while ensuring cost reduction and prevent an increase in weight of the gate commutated turn-off semiconductor device.

In the gate commutated turn-off semiconductor device of the second aspect of the present invention, since both the first and second circuit patterns are formed on the first main surface of the substrate and it is not necessary to form the electrode patterns on both surfaces of the substrate, unlike the prior-art gate commutated turn-off semiconductor device, it is possible to suppress the time and cost required for manufacture. Further, since the branch-like protrusion of the cathode flange and that of the gate flange are fixed on one surface of the substrate, it is not necessary to perform the step of attaching the screws to both surfaces of the substrate and the like and the working efficiency in the manufacturing process and maintenance is improved.

In the gate commutated turn-off semiconductor device of the third aspect of the present invention, the first circuit pattern is formed entirely on the first main surface of the substrate and the second circuit pattern is formed entirely on the second main surface thereof. This can reduce the inductance on the gate side.

In the gate commutated turn-off semiconductor device of the fourth aspect of the present invention, since the branch-like protrusion and the member sandwiched between the cathode post electrode and the cathode fin electrode are formed as a unit, such a structure can be easily obtained by one press.

In the gate commutated turn-off semiconductor device of the fifth aspect of the present invention, since the cathode flange uses the member surrounding the cathode post electrode, instead of the member sandwiched between the cathode post electrode and the cathode fin electrode, it is possible to reduce the electric resistance between the cathode fin electrode and the cathode post electrode and suppress heat generation caused by the switching operation.

In the gate commutated turn-off semiconductor device of the sixth aspect of the present invention, since the branch-like protrusion has the bend portion, it is possible to fit the position of the branch-like protrusion to a position where the substrate is present. Further, it is possible to absorb the oscillation and stress caused by the switching operation in the bend portion.

In the gate commutated turn-off semiconductor device of the seventh aspect of the present invention, since at least three branch-like protrusions are provided, the gate commutated turn-off semiconductor device becomes unlikely to resonate and twist due to the oscillation and stress caused by the switching operation.

In the gate commutated turn-off semiconductor device of the eighth aspect of the present invention, since the substrate has the reinforcing member fixed to its surface, it is possible to suppress the bend of the substrate.

In the gate commutated turn-off semiconductor device of the ninth aspect of the present invention, since the cathode fin electrode is fixed to the upright portion of the reinforcing member, it is possible to further suppress the bend of the substrate.

In the gate commutated turn-off semiconductor device of the tenth aspect of the present invention, the screw pedestal does not need to have a surface of highly precise flatness, unlike the cathode spacer and the gate spacer in the prior-art gate commutated turn-off semiconductor device, and therefore commercial cheap parts can be used for the pedestal.

An object of the present invention is to provide a gate commutated turn-off semiconductor device which eliminates the necessity of a gate spacer and a cathode spacer and ensures reduction in time and cost required for manufacturing the device.

These and other objects, features, aspects and advantages of the present invention will become more apparent from the following detailed description of the present invention when taken in conjunction with the accompanying drawings.

DESCRIPTION OF THE PREFERRED EMBODIMENTS

The First Preferred Embodiment

Figure 1:
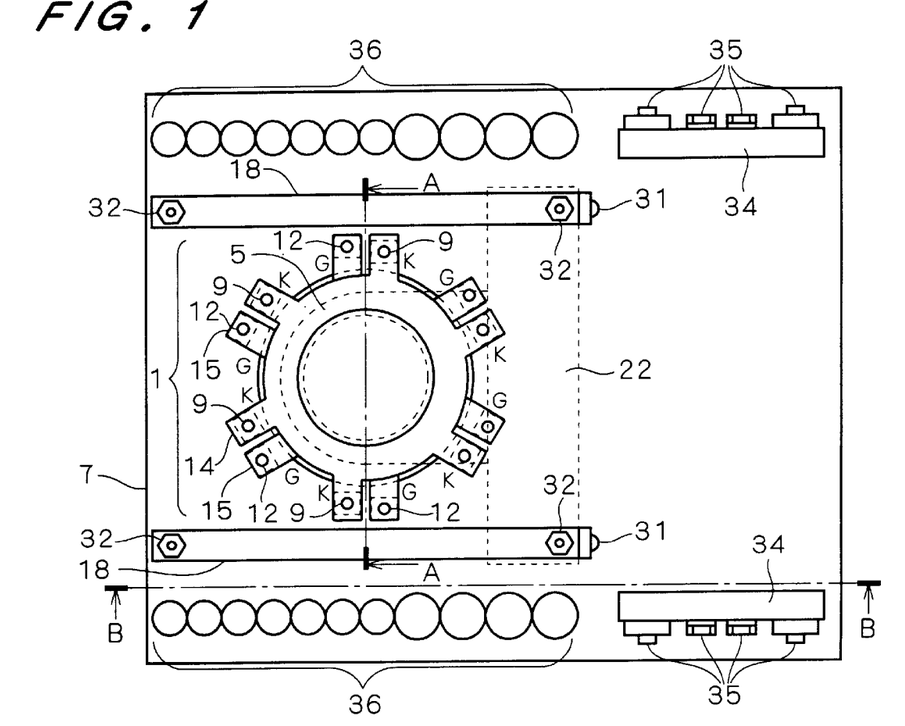
FIG. 1 is a plan view showing a gate commutated turn-off semiconductor device in accordance with a first preferred embodiment of the present invention.
Figure 2:
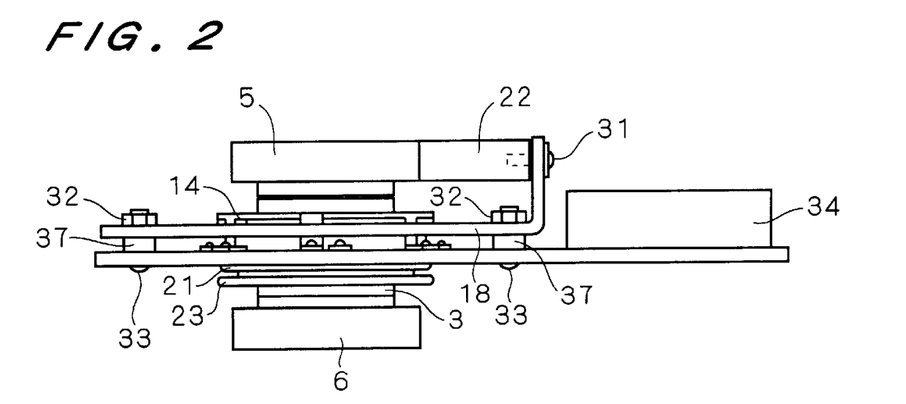
FIG. 2 is a cross section showing the gate commutated turn-off semiconductor device in accordance with the first preferred embodiment of the present invention.

FIG. 1 is a plan view showing a gate commutated turn-off semiconductor device in accordance with the first preferred embodiment of the present invention. FIG. 2 is a cross section taken in the section line B—B of FIG. 1. The gate commutated turn-off semiconductor device comprises the gate drive substrate 7, a GCT thyristor 1 fixed on the gate drive substrate 7 and a gate driver including capacitors 36 and transistors 35. The transistors 35 are provided on a wall surface of a wall member 34 fixed perpendicularly on the gate drive substrate 7. Though the capacitors 36 are provided on the gate drive substrate 7, these are not shown in FIG. 2 for simple illustration.

Figure 3:
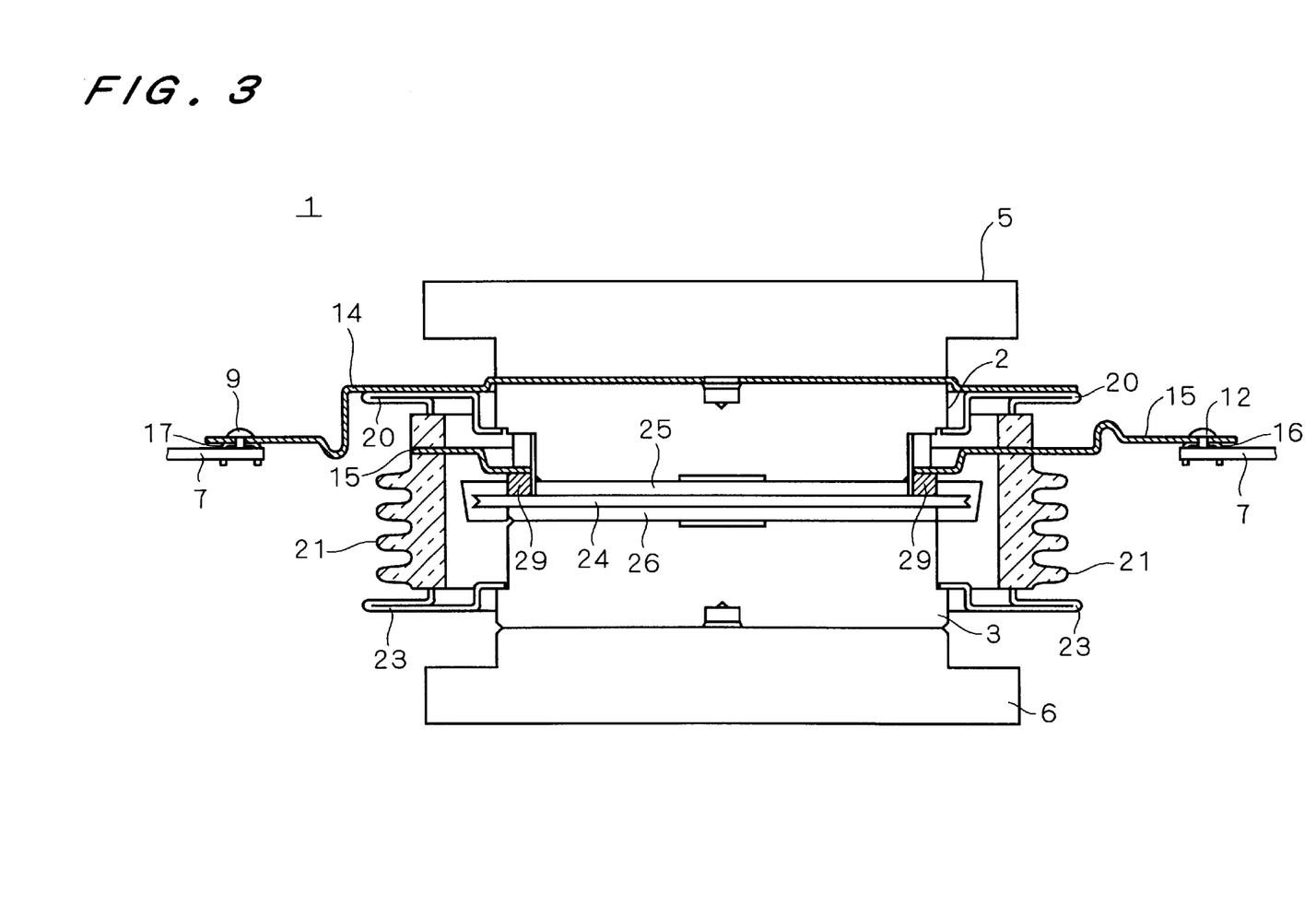
FIG. 3 is a cross section of a GCT thyristor 1 included in the gate commutated turn-off semiconductor device in accordance with the first preferred embodiment of the present invention.
Figure 4:
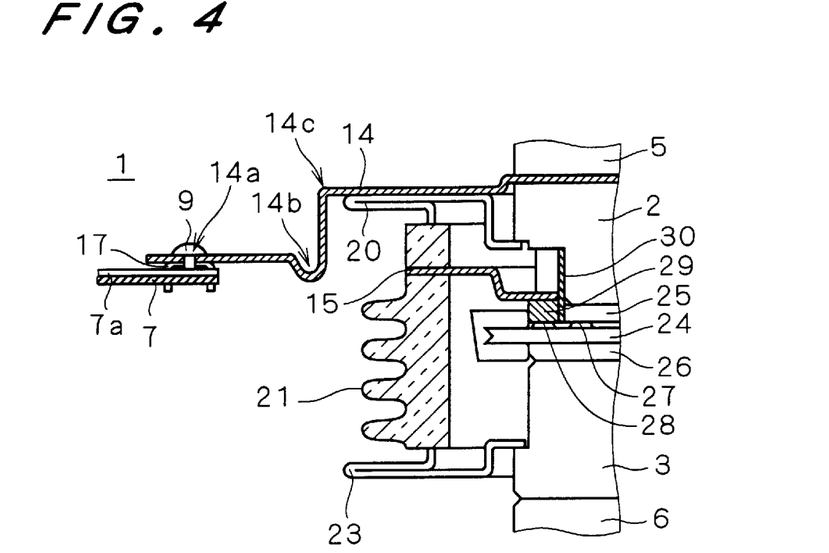
FIGS. 4 and 5 are cross sections each showing an enlarged part of the GCT thyristor 1 included in the gate commutated turn-off semiconductor device in accordance with the first preferred embodiment of the present invention.
Figure 5:
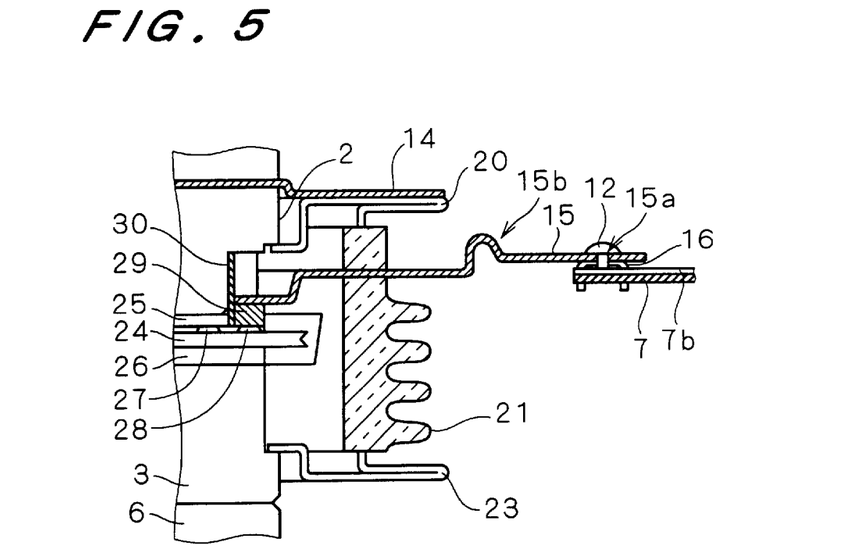

FIG. 3 is a cross section taken in the section line A—A of FIG. 1. FIGS. 4 and 5 are cross sections showing enlarged parts of FIG. 3. The GCT thyristor 1 comprises the disk-shaped semiconductor substrate (wafer) 24 having a pnpn structure and the gate region on its outer peripheral side, the cathode strain buffer plate 25 connected to the cathode region of the semiconductor substrate 24 and the anode strain buffer plate 26 connected to the anode region of the semiconductor substrate 24, on its center portion, like the GCT thyristor 100 in the above prior-art gate commutated turn-off semiconductor device. The cathode post electrode 2 is connected to the cathode strain buffer plate 25 and the anode post electrode 3 is connected to the anode strain buffer plate 26. Further, a first cathode flange 14 which is conductive is connected to the cathode post electrode 2 and the cathode fin electrode 5 is connected to the first cathode flange 14. The anode fin electrode 6 is connected to the anode post electrode 3. The semiconductor substrate 24, the cathode strain buffer plate 25, the anode strain buffer plate 26, the cathode post electrode 2, the anode post electrode 3 and the first cathode flange 14 are sandwiched and pressed by the cathode fin electrode 5 and the anode fin electrode 6. In FIG. 1, the cathode fin electrode 5 is represented by the broken line.

The GCT thyristor 1 further comprises a second cathode flange 20 in a ring shape held by the cathode post electrode 2 penetrating therethrough and the ring-shaped anode flange 23 held by the anode post electrode 3 penetrating therethrough. The insulating tube 21 made of ceramics (e.g., alumina) is provided between the second cathode flange 20 and the anode flange 23. In FIG. 3, the semiconductor substrate 24, the cathode strain buffer plate 25, the anode strain buffer plate 26, the cathode post electrode 2 and the anode post electrode 3 penetrate as a unit through the insulating tube 21.

As shown in FIGS. 4 and 5, in the GCT thyristor 1, both the cathode electrode 7a serving as a passage of a current between the gate driver and the cathode of the GCT thyristor 1 and the gate electrode 7b serving as a passage of a current between the gate driver and the gate of the GCT thyristor 1 are formed on the upper surface of the gate drive substrate 7, unlike in the GCT thyristor 100. As a matter of course, both electrodes 7a and 7b are formed in circuit patterns insulated from each other. Though these circuit patterns are not shown in FIG. 1, for simple illustration, the cathode electrode 7a is formed in such a circuit pattern as to be connected to a branch-like protrusion of the first cathode flange 14 discussed later and the gate electrode 7b is formed in such a circuit pattern as to be connected to a branch-like protrusion of a gate flange 15 discussed later. Providing the cathode electrode 7a and the gate electrode 7b forms a loop between the gate and cathode of the GCT thyristor 1 and the gate driver. With the gate current flowing into this loop at the commutation, the main current flowing between the cathode and anode of the GCT thyristor 1 is immediately stopped.

Figure 6:
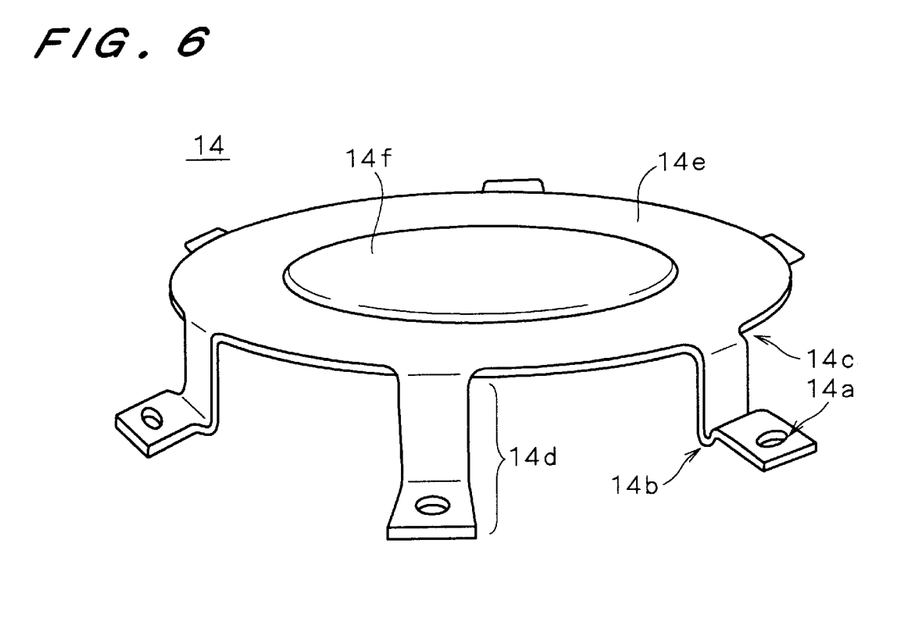
FIG. 6 is a perspective view showing a structure of a first cathode flange 14 of the GCT thyristor 1 included in the gate commutated turn-off semiconductor device in accordance with the first preferred embodiment of the present invention.

A structure of the first cathode flange 14 is shown in FIG. 6. The first cathode flange 14 is a conductive thin plate having a thickness of e.g., about 0.2 to 2 mm and comprises a disk-like portion 14f having substantially the same diameter as that of the cathode post electrode 2, a flange portion 14e surrounding the disk-like portion 14f and a plurality of branch-like protrusions 14d extending towards substantially its outer periphery from the flange portion 14e, as shown in FIG. 6. This structure can be obtained by processing a thin plate with a pressing machine and the like. Such a structure in which the branch-like protrusions 14d, the flange portion 14e and the disk-like portion 14f are formed as a unit, like the first cathode flange 14, can be easily obtained by one press.

Each of the branch-like protrusions 14d has a screw hole 14a in the vicinity of its tip portion, and the branch-like protrusion 14d is fixed on the gate drive substrate 7 by inserting the screw 9 in the screw hole 14a as shown in FIG. 4. Further, a conductive screw pedestal 17 is provided on a portion of the gate drive substrate 7 corresponding to the screw hole 14a, and the branch-like protrusion 14d comes into conduction with the cathode electrode 7a with the screw pedestal 17 interposed therebetween. Furthermore, the screw pedestal 17 can be attached to the gate drive substrate 7 by e.g., soldering.

Further, commercial cheap pedestal parts may be used for the screw pedestal 17. This is because the screw pedestal 17 has only to be in contact with the branch-like protrusion 14d and does not need to have a surface of highly precise flatness, unlike the cathode spacer 4 and the gate spacer 10 in the prior-art gate commutated turn-off semiconductor device.

The branch-like protrusion 14d, not extending towards straightly horizontal direction from the flange portion 14e, has some bend portions 14b and 14c so as to fit the position of the screw hole 14a to a position where the gate drive substrate 7 is present. Among them, the bend portion 14b has a sufficient bend. Therefore, the bend portion 14b especially absorbs the oscillation and stress caused by the switching operation.

In the semiconductor substrate 24, the gate region is formed on the side of the cathode region and the ring-shaped gate electrode 29 is connected to the gate region with a gate electrode connection layer 28 interposed therebetween as shown in FIG. 5. The gate electrode 29 is connected to the inner peripheral side of the gate flange 15. The cathode strain buffer plate 25 is connected to the cathode region on the semiconductor substrate 24 with a cathode electrode connection layer 27 interposed therebetween.

Figure 7:
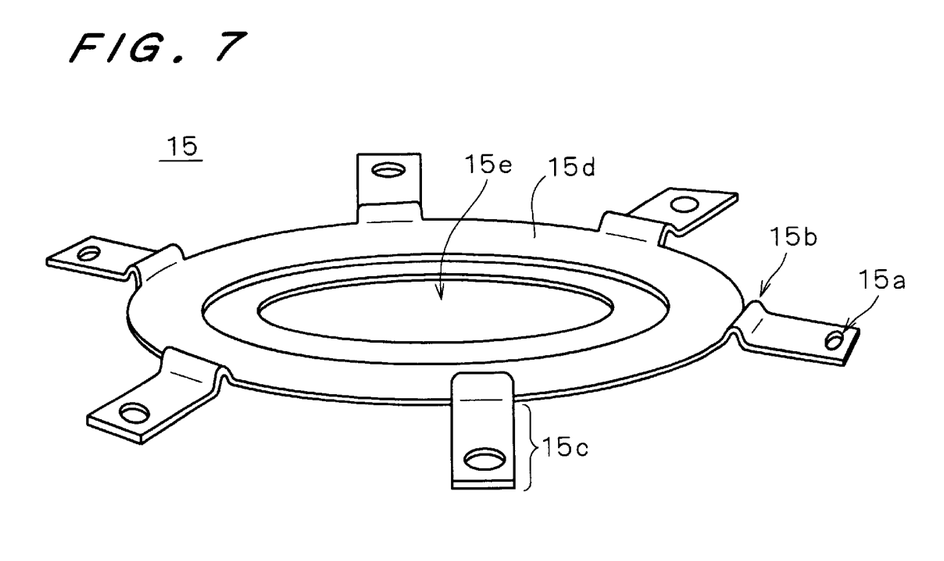
FIG. 7 is a perspective view showing a structure of a gate flange 15 of the GCT thyristor 1 included in the gate commutated turn-off semiconductor device in accordance with the first preferred embodiment of the present invention.

A structure of the gate flange 15 is shown in FIG. 7. The gate flange 15 is a conductive thin plate having a thickness of e.g., about 0.2 to 2 mm and comprises a ring hole portion 15e through which the cathode post electrode 2 penetrates, a ring-shaped portion 15d surrounding the ring hole portion 15e and a plurality of branch-like protrusions 15c extending towards substantially its outer periphery from the ring-shaped portion 15d, as shown in FIG. 7.

Each of the branch-like protrusions 15c has a screw hole 15a in the vicinity of its tip portion, and the branch-like protrusion 15c is fixed on the gate drive substrate 7 by inserting the screw 12 in the screw hole 15a as shown in FIG. 5. Further, a conductive screw pedestal 16 like the screw pedestal 17 is provided on a portion of the gate drive substrate 7 corresponding to the screw hole 15a, and the branch-like protrusion 15c comes into conduction with the gate electrode 7b with the screw pedestal 16 interposed therebetween. Furthermore, commercial cheap pedestal parts may be used for the screw pedestal 16, like the screw pedestal 17, and the screw pedestal 16 can be attached to the gate drive substrate 7 by e.g., soldering.

The branch-like protrusion 15c, not extending towards straightly horizontal direction from the ring-shaped portion 15d, has a bend portion 15b so as to fit the position of the screw hole 15a to a position where the gate drive substrate 7 is present. The bend portion 15b has a sufficient bend and therefore absorbs the oscillation and stress caused by the switching operation.

Further, as shown in FIG. 5, an insulating sheet 30 is provided to ensure insulation between a pair of the gate electrode 29 and the gate flange 15 and a pair of the cathode strain buffer plate 25 and the cathode post electrode 2.

The ring-shaped portion 15d of the gate flange 15, being sandwiched by the insulating tube 21, protrudes from the side surface of the insulating tube 21 and extends towards the outside of the insulating tube 21. The branch-like protrusion 15c of the gate flange 15 extends outside the insulating tube 21.

FIG. 1 shows an exemplary case where the first cathode flange 14 has six branch-like protrusions 14d and the gate flange 15 has six branch-like protrusions 15c. The branch-like protrusions 14d and 15c are provided at positions by which respective circumferences of the first cathode flange 14 and the gate flange 15 are divided into six equal parts. The branch-like protrusion 14d of the first cathode flange 14 and the branch-like protrusion 15c of the gate flange 15 which are adjacent to each other are so provided as to be substantially in parallel with each other, and the branch-like protrusions 14d and the branch-like protrusions 15c are so provided as to alternate with one another. The distance between the branch-like protrusions 14d and 15c is designed to be the minimum limit to ensure insulation or more. If the distance between the branch-like protrusions 14d and 15c and the cathode fin electrode 5 and that between the branch-like protrusions 14d and 15c and the anode fin electrode 6 are designed to be larger, it is possible to suppress the possibility of carrying leak currents from external circuits connected to the cathode fin electrode 5 or the anode fin electrode 6 to the branch-like protrusions 14d and 15c to lower level. For that, a relative positional relation between the gate drive substrate 7 and the GCT thyristor 1 in a direction of height may be determined by controlling the bend portions 14b, 14c and 15b of the branch-like protrusions 14d and 15c.

Further, it is desirable that the number of branch-like protrusions 14d of the first cathode flange 14 and the number of the branch-like protrusions 15c of the gate flange 15 should be each three or more. With one branch-like protrusion, it is difficult to hold the GCT thyristor 1 and there is little difference from the prior-art method of drawing a gate current from one direction. With two branch-like protrusions, the GCT thyristor 1 is likely to resonate and twist due to the oscillation and stress caused by the switching operation. With three branch-like protrusions 14d and three branch-like protrusions 15c, by providing them at positions by which respective circumferences of the first cathode flange 14 and the gate flange 15 are divided into three equal parts, the GCT thyristor 1 becomes unlikely to resonate and twist due to the oscillation and stress caused by the switching operation.

As to the number more than three, the number of branch-like protrusions is determined with consideration to the current capacity of the GCT thyristor 1, the gate reverse current rise rate ($di_{GQ}/dt$) required for the GCT thyristor 1 at the turn-off, the required inductance value, working efficiency and cost in the manufacturing process and the like.

With the gate commutated turn-off semiconductor device of the first preferred embodiment, it is possible to ensure cost reduction and prevent an increase in weight of the device since neither the cathode spacer nor the gate spacer used in the prior-art gate commutated turn-off semiconductor device is used and the gate flange 15 and the first cathode flange 14 can be fixed onto the gate drive substrate 7 with a cheap pedestal part.

Further, since the branch-like protrusions 14d of the first cathode flange 14 and the branch-like protrusions 15c of the gate flange 15 are fixed on one surface of the gate drive substrate 7 with the screws, there is no necessity of attaching the screws to both the upper and lower surfaces of the gate drive substrate 7, unlike in the prior-art gate commutated turn-off semiconductor device, and the working efficiency is improved in the manufacture process and maintenance.

Furthermore, since there is no necessity of forming the electrode patterns on both the upper and lower surfaces of the gate drive substrate 7, unlike in the prior-art gate commutated turn-off semiconductor device, and the electrode patterns for gate and cathode are formed only on the upper surface of the gate drive substrate 7, it is possible to reduce the time and cost required in manufacture.

There arises concern about deficiency in strength because the gate commutated turn-off semiconductor device of the first preferred embodiment has no case which is provided in the prior-art gate commutated turn-off semiconductor device. Therefore, to achieve sufficient strength, a reinforcing member 18 is provided as shown in FIGS. 1 and 2. In FIGS. 1 and 2, as an example, two L-shaped reinforcing members 18 are so provided in parallel with each other as to sandwich the GCT thyristor 1 and fixed on the gate drive substrate 7 with screws 33 and nuts 32 while insulation between the reinforcing members 18 and the gate drive substrate 7 with insulative spacers 37. This suppresses a bend of the gate drive substrate 7 due to a load of the transistor and the like.

A horizontal-direction member 22 is fixed to a portion of the reinforcing member 18 perpendicular to the gate drive substrate 7 with a screw 31 in order to fix the cathode fin electrode 5 to the reinforcing member 18. Herein, as an example, the cathode fin electrode 5 in a shape like a symbol of AND gate is used and its plane portion is fixed to the horizontal-direction member 22 by laser-beam welding with e.g., YAG laser, arc welding and the like. Further, a cathode fin electrode in a shape in which the cathode fin electrode 5 and the horizontal-direction member 22 are formed as a unit may be used to fix the reinforcing member 18.

Thus, by fixing the cathode fin electrode 5 to the reinforcing member 18, it is possible to further suppress the bend of the gate drive substrate 7 due to the load of the transistor 35 and the like.

The Second Preferred Embodiment

The second preferred embodiment is a variation of the gate commutated turn-off semiconductor device of the first preferred embodiment. Specifically, the first cathode flange 14 is omitted and instead, the second cathode flange 20 is provided with branch-like protrusions.

Figure 8:
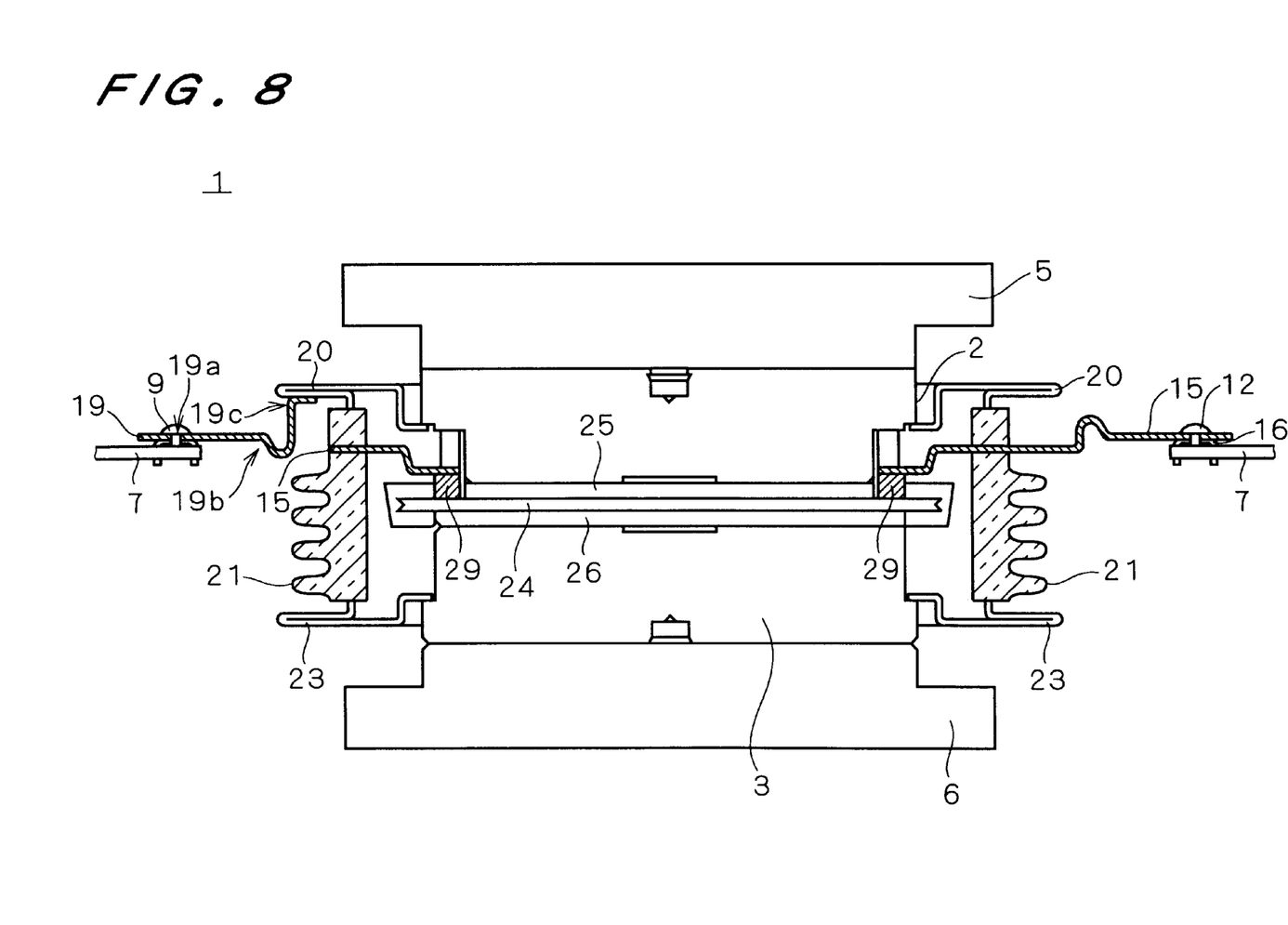
FIG. 8 is a cross section of the GCT thyristor 1 included in a gate commutated turn-off semiconductor device in accordance with a second preferred embodiment of the present invention.

FIG. 8 is a cross section showing a gate commutated turn-off semiconductor device in accordance with the second preferred embodiment of the present invention. In FIG. 8, elements having the same functions as those in the gate commutated turn-off semiconductor device of the first preferred embodiment are represented by the same reference signs. The gate commutated turn-off semiconductor device of the second preferred embodiment does not have the first cathode flange 14, and instead, a branch-like protrusion 19 is fixed to the second cathode flange 20 by laser-beam welding with e.g., YAG laser, arc welding and the like.

Figure 9:
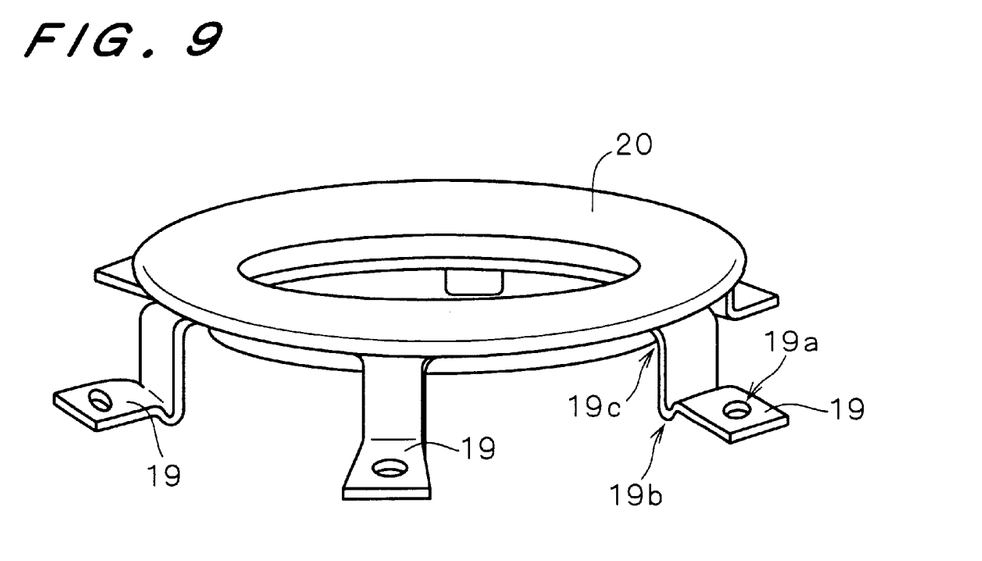
FIG. 9 is a perspective view showing a structure of a second cathode flange 20 and branch-like protrusions 19 of the GCT thyristor 1 included in the gate commutated turn-off semiconductor device in accordance with the second preferred embodiment of the present invention.

FIG. 9 is a perspective view showing the second cathode flange 20 and the branch-like protrusions 19. Each of the branch-like protrusions 19 has a screw hole 19a in the vicinity of its tip portion, like the branch-like protrusion 14d of the first cathode flange 14, and the branch-like protrusion 19 is fixed onto the screw pedestal 17 on the gate drive substrate 7 by inserting the screw 9 in the screw hole 19a as shown in FIG. 8.

The branch-like protrusion 19, not extending towards straightly horizontal direction from the second cathode flange 20, has some bend portions 19b and 19c so as to fit the position of the screw hole 19a to a position where the gate drive substrate 7 is present, like the branch-like protrusion 14d of the first cathode flange 14.

Since structural features other than the above are the same as those of the gate commutated turn-off semiconductor device of the first preferred embodiment, no discussion will be made thereon.

With the gate commutated turn-off semiconductor device of the second preferred embodiment, it is possible to reduce the electric resistance between the cathode fin electrode 5 and the cathode post electrode and suppress heat generation caused by the switching operation since the first cathode flange 14 is omitted.

The Third Preferred Embodiment

The third preferred embodiment is a variation of the gate commutated turn-off semiconductor device of the first preferred embodiment. Specifically, the branch-like protrusions 15c of the gate flange 15 are connected to the lower surface of the gate drive substrate 7, not to the upper surface thereof.

Figure 10:
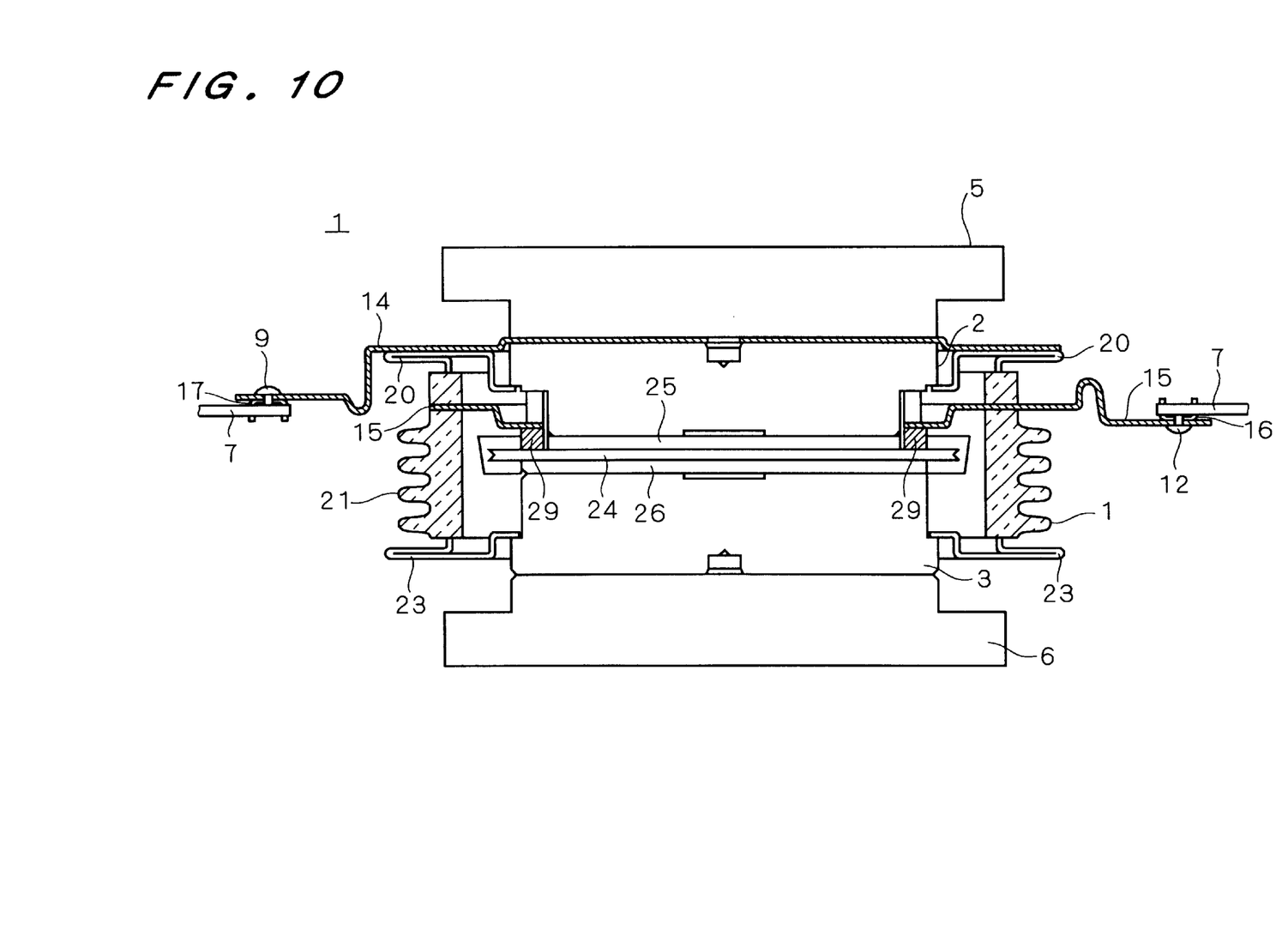
FIG. 10 is a cross section of the GCT thyristor 1 included in a gate commutated turn-off semiconductor device in accordance with a third preferred embodiment of the present invention.

FIG. 10 is a cross section showing a gate commutated turn-off semiconductor device in accordance with the third preferred embodiment of the present invention. In FIG. 10, elements having the same functions as those in the gate commutated turn-off semiconductor device of the first preferred embodiment are represented by the same reference signs. In the gate commutated turn-off semiconductor device of the third preferred embodiment, the branch-like protrusion 15c of the gate flange 15 is connected to the lower surface of the gate drive substrate 7, not to the upper surface thereof.

In the gate commutated turn-off semiconductor device of the third preferred embodiment, unlike in the first preferred embodiment, the cathode electrode 7a is formed entirely on the upper surface of the gate drive substrate 7 and the gate electrode 7b is formed entirely on the lower surface thereof. Further, on the lower surface of the gate drive substrate 7, the screw pedestal 16 is provided on a portion corresponding to the screw hole 15a, and the branch-like protrusion 15c comes into conduction with the gate electrode 7b with the screw pedestal 16 interposed therebetween.

Since structural features other than the above are the same as those of the gate commutated turn-off semiconductor device of the first preferred embodiment, no discussion will be made thereon.

With the gate commutated turn-off semiconductor device of the third preferred embodiment, the cathode electrode 7a is formed entirely on the upper surface of the gate drive substrate 7 and the gate electrode 7b is formed entirely on the lower surface thereof, and the branch-like protrusion 15c of the gate flange 15 is connected to the lower surface of the gate drive substrate 7. Therefore, though the working efficiency in the manufacturing process and maintenance is deteriorated as compared with the gate commutated turn-off semiconductor device of the first preferred embodiment, it is possible to form the cathode electrode 7a and the gate electrode 7b entirely on the front and rear surfaces of the gate drive substrate 7, respectively. This ensures reduction of the inductance on the gate side.

While the invention has been shown and described in detail, the foregoing description is in all aspects illustrative and not restrictive. It is therefore understood that numerous modifications and variations can be devised without departing from the scope of the invention.

What is claimed is:

1. A gate commutated turn-off semiconductor device, comprising:

a gate commutated turn-off semiconductor element having an anode, a cathode and a gate, for commutating a main current flowing from said anode to said cathode into a side of said gate at a turn-off;

a gate driver for controlling a current flowing in said gate; and a substrate provided with a circuit pattern on its surface, said circuit pattern electrically connecting said gate and said cathode of said gate commutated turn-off semiconductor element to said gate driver to form an electrical loop, wherein said gate commutated turn-off semiconductor element has a semiconductor substrate having a cathode region, an anode region and a gate region, in which said gate region is formed on an outer peripheral side of one main surface, said cathode region is formed inside said gate region of said one main surface and said anode region is formed on the other main surface opposed to said one main surface;

a gate electrode in a ring shape connected electrically to said gate region;

a cathode post electrode connected electrically to said cathode region;

an anode post electrode connected electrically to said anode region;

an insulating tube being electrically insulative, provided so as to surround said anode post electrode and said cathode post electrode and internally containing at least said semiconductor substrate and said gate electrode;

a gate flange having an inner peripheral side connected electrically to said gate electrode and an outer peripheral edge portion protruding from a side surface of said insulating tube; and a cathode flange connected electrically to said cathode post electrode, wherein said cathode flange and said gate flange each include a plurality of individual branch-like protrusions extending towards an outer periphery thereof, said cathode of said gate commutated turn-off semiconductor element is electrically connected to said substrate and said cathode flange is fixed to said substrate with said branch-like protrusions interposed therebetween, and said gate of said gate commutated turn-off semiconductor element is electrically connected to said substrate and said gate flange is fixed to said substrate with said branch-like protrusions interposed therebetween, and wherein the cathode and gate flanges are fixed to the substrate without spacers disposed therebetween.

2. The gate commutated turn-off semiconductor device according to claim 1, wherein said substrate has a first main surface and a second main surface opposed to said first main surface, said circuit pattern includes a first circuit pattern formed on said first main surface, for electrically connecting said cathode to said gate driver, and a second circuit pattern formed on said first main surface, for electrically connecting said gate to said gate driver, said branch-like protrusion included in said cathode flange is connected to said first circuit pattern, and said branch-like protrusion included in said gate flange is connected to said second circuit pattern.

3. The gate commutated turn-off semiconductor device according to claim 1, wherein said substrate has a first main surface and a second main surface opposed to said first main surface, said circuit pattern includes a first circuit pattern formed on said first main surface, for electrically connecting said cathode to said gate driver, and a second circuit pattern formed on said second main surface, for electrically connecting said gate to said gate driver, said branch-like protrusion included in said cathode flange is connected to said first circuit pattern, and said branch-like protrusion included in said gate flange is connected to said second circuit pattern.

4. The gate commutated turn-off semiconductor device according to claim 1, wherein said gate commutated turn-off semiconductor element further comprises a cathode fin electrode connected electrically to said cathode flange, and said cathode flange is a member sandwiched between said cathode post electrode and said cathode fin electrode, and said branch-like protrusion and said member are formed as a unit.

5. The gate commutated turn-off semiconductor device according to claim 1, wherein said cathode flange is a member surrounding said cathode post electrode, and said branch-like protrusion is formed with another member different from said member fixed thereto.

6. The gate commutated turn-off semiconductor device according to claim 1, wherein said branch-like protrusion of at least one of said cathode flange and said gate flange has a bend portion.

7. The gate commutated turn-off semiconductor device according to claim 1, wherein said cathode flange and said gate flange each include at least three branch-like protrusions.

8. The gate commutated turn-off semiconductor device according to claim 1, wherein said substrate has a reinforcing member fixed to said surface thereof.

9. The gate commutated turn-off semiconductor device according to claim 8, wherein said gate commutated turn-off semiconductor element further comprises a cathode fin electrode connected electrically to said cathode flange, and said reinforcing member comprises an upright portion perpendicular to said substrate and said cathode fin electrode is fixed to said upright portion.

10. The gate commutated turn-off semiconductor device according to claim 1, wherein said branch-like protrusion is provided with a screw hole in the vicinity of its tip portion, said substrate is provided with screw pedestals, a screw penetrates through said screw hole of said gate flange and is threaded to one of said screw pedestals to fix said gate flange to said substrate, and a screw penetrates through said screw hole of said cathode flange and is threaded to another of said screw pedestals to fix said cathode flange to said substrate.

11. The gate commutated turn-off semiconductor device according to claim 7, wherein each of said branch-like protrusions of said cathode flange is substantially parallel to one of said branch-like protrusions of said gate flange.

12. The gate commutated turn-off semiconductor device according to claim 7, wherein said branch-like protrusions of said cathode flange and said branch-like protrusions of said gate flange alternate with each other.

* * * * *